United States Patent [19]

Komori

[11] Patent Number: 4,858,308
[45] Date of Patent: Aug. 22, 1989

[54] PARTS MOUNTING APPARATUS

[75] Inventor: Ken-ichi Komori, Kasai, Japan

[73] Assignee: Sanyo Electric Co., Ltd., Japan

[21] Appl. No.: 196,437

[22] Filed: May 20, 1988

[30] Foreign Application Priority Data

May 28, 1987 [JP] Japan .............................. 62-132304

[51] Int. Cl.$^4$ ............................................ B23P 19/00
[52] U.S. Cl. ...................................... 29/740; 29/741;
29/743; 29/739; 29/785; 29/33 J; 29/35.5
[58] Field of Search ................. 29/743, 785, 740, 741,
29/739, 33 K, 33 J, 35.5, 689; 294/64.1

[56] References Cited

U.S. PATENT DOCUMENTS

| | | | |
|---|---|---|---|
| 4,458,412 | 7/1984 | Dean et al. | 29/740 |
| 4,611,397 | 9/1986 | Janislewicz | 29/834 |
| 4,705,311 | 11/1987 | Ragard | 29/743 |
| 4,769,904 | 9/1988 | Porterfield et al. | 29/840 |

Primary Examiner—P. W. Echols
Assistant Examiner—K. Jordan
Attorney, Agent, or Firm—Darby & Darby

[57] ABSTRACT

A parts mounting apparatus includes a rotary-index table having vacuum suction devices on a periphery thereof. A removable suction piece is attached to each of the vacuum suction devices so as to perform picking and placing operations of parts. A suction piece stocker is disposed across a detaching station and an attaching station. A detaching device is arranged at the detaching station, wherein the suction piece is come to be detached from the vacuum suction device and held by a stocker when the vacuum suction device is lowered and then raised. When the vacuum suction device which has lost the suction piece is lowered at the attaching station, a suction piece is attached to the vacuum suction device. When the vacuum suction device is raised in that state, the suction piece is pulled out from the stocker. Thus, exchanging of suction piece can be performed.

22 Claims, 14 Drawing Sheets

PARTS MOUNTING APPARATUS

BACKGROUND OF THE INVENTION

1. Field of the invention

The present invention relates to a parts mounting apparatus. More specifically, the present invention relates to an apparatus for mounting small electronic parts such as a chip capacitor and chip resistor onto a printed circuit board through a series of work stations which are arranged in a closed-loop fashion at a periphery of a rotary-index table.

2. Description of the prior art

In the aforementioned apparatus, generally, a picking and placing operation of the parts is performed by a vacuum suction device. Recently, the variety of such parts are becoming wider. Therefore, a large variety of parts must be handled by a single mounting apparatus as much as possible. For this purpose, suction pieces having various shapes must be provided on the single mounting apparatus so as to be suited to objects. Making the suction pieces removable from the vacuum suction device is considered to be a way to form a proper mating of suction piece and part. Such examples are shown in, for example, Japanese Patent Application Laid-Open No. 69992/1984 and Utility Model Application Laid-Open No. 47167/1987. However, generally speaking, such an apparatus is just a robot arm provided with the vacuum suction device having a tool exchanging function, and it is hard to say that they are suitable for use in mounting a large number of parts at high speed.

More specifically, in the conventional X-Y robot type parts mounting apparatus, the vacuum suction device is moved reciprocally between a parts supply device and a printed circuit board if the suction piece is not intended to be exchanged. When the suction piece is to be exchanged after mounting of the part, the vacuum suction device is moved to a side path other than the moving path between the printed circuit board and the parts supply device, and the suction piece is changed in the side path. Thus, in the case where the suction piece is to be changed in the X-Y robot type parts mounting apparatus, an operation cycle becomes redundant and an operation speed becomes slow in comparison with the case where no suction piece is to be changed. Therefore, until now, there was no approach to incorporate "suction piece exchanging operation" which necessitates such a redundant operation cycle into the rotary-index table type parts mounting apparatus designed so as to perform a high-speed operation.

Furthermore, in the conventional X-Y robot type parts mounting apparatus, the vacuum suction device can be relatively freely moved in a desired path; however, in the rotary-index table type parts mounting apparatus, the vacuum suction device can be moved in only the fixed moving path. Such a lack of freedom in movement of the vacuum suction device in the rotary-index table type parts mounting apparatus also prevented a tool exchange system of the X-Y robot type parts mounting apparatus from being combined with the rotary-index table type parts mounting apparatus.

SUMMARY OF THE INVENTION

Therefore, it is a principal object of the present invention to provide a novel parts mounting apparatus.

It is another object of the present invention to provide a rotary-index table type parts mounting apparatus capable of exchanging a suction piece.

It is the other object of the present invention to provide a high-speed parts mounting apparatus having a function of automatically exchanging suction pieces According to the present invention, a plurality of suction devices are moved intermittently along a closed-loop path from one work station to the other. The suction piece on the suction device is removable, and in response thereto, a suction piece stocker having a plurality of suction piece holders is disposed.

The suction device executes a picking and placing operation of the parts as moving intermittently along the closed-loop path. The suction piece stocker moves to bring one selected suction piece holder in agreement with the stop position of the suction device, and the suction piece is loaded to the suction piece holder from the suction device or vice versa.

In accordance with the present invention, since a suction piece can be exchanged after mounting parts, the original parts mounting operation and exchange of suction pieces as a preparatory work of the former can be carried out simultaneously without causing discontinuity in mounting operations as such that, while one suction device performs a picking and placing operation of the part, another suction device exchanges the suction piece, thus a purpose of exchanging the suction piece can be automatically achieved without spoiling the high-speed operability of such an apparatus.

The objects and other objects, features, aspects and advantages of the present invention will become more apparent from the following detailed description of the embodiments of the present invention when taken in conjunction with accompanying drawings

DETAIL DESCRIPTION OF THE PREFERRED EMBODIMENT

General Configuration

Figure 1:
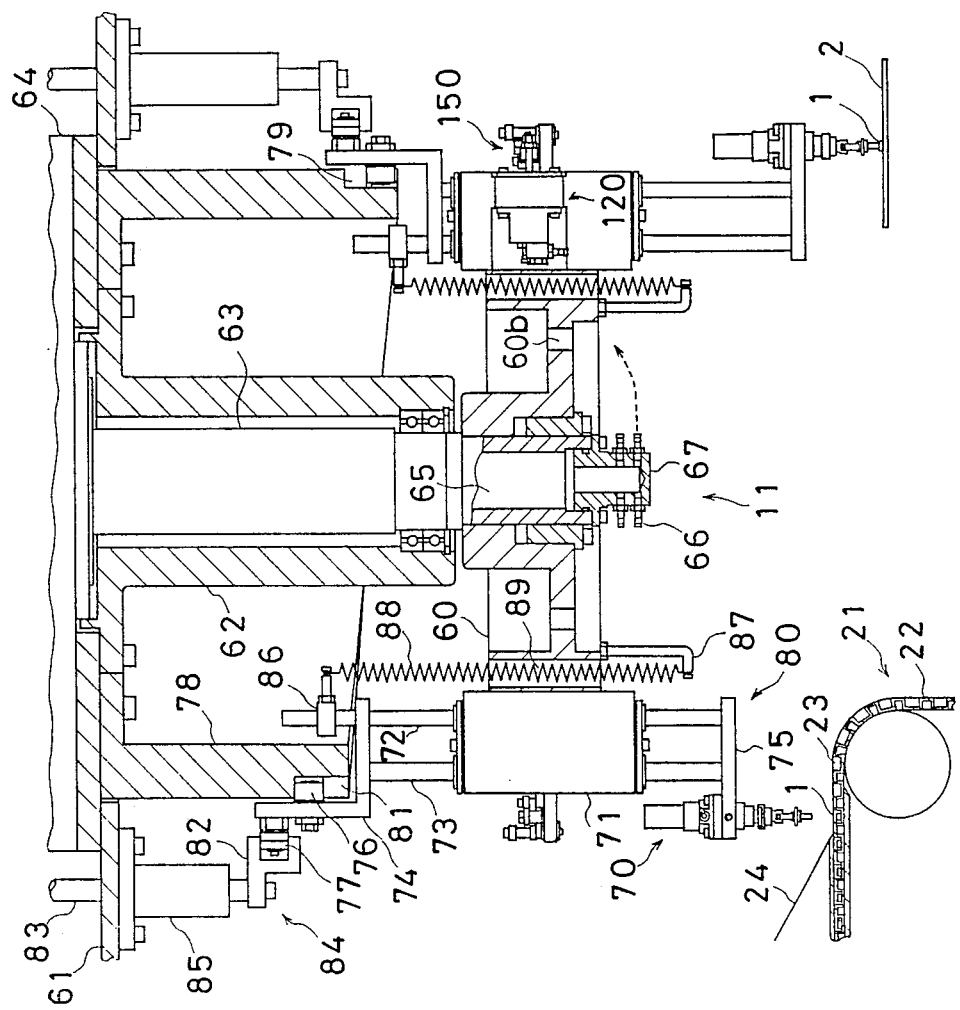
FIG. 1 is a sectional view of a mounting unit.
Figure 2:
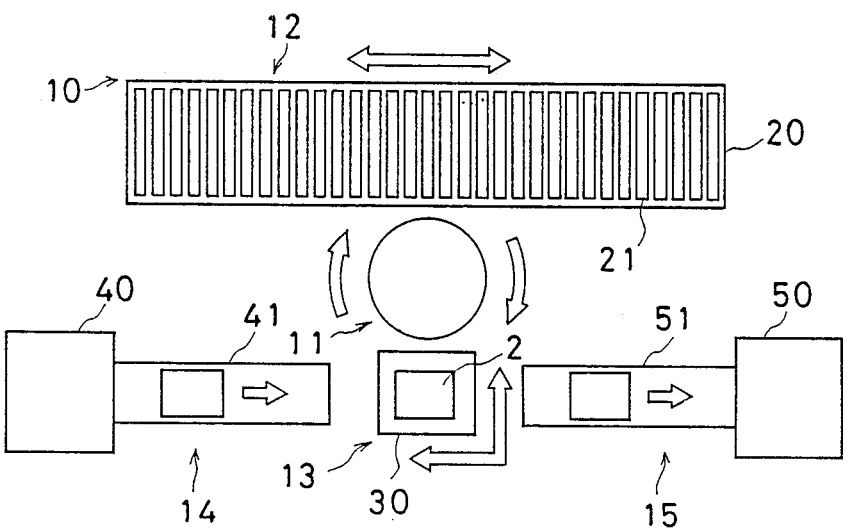
FIG. 2 is a view illustrating an arrangement of a plurality of units constituting a parts mounting apparatus.

Arrangement of units constituting a parts mounting apparatus 10 as viewed in plan view is schematically shown in FIG. 2. The units includes a mounting unit 11, parts supply unit 12, printed circuit board support unit 13, printed circuit board loading unit 14 and printed circuit board unloading unit 15. The mounting unit 11 includes a rotary-index table type support provided with a plurality of vacuum suction devices on the periphery thereof. The parts supply unit 12 is adapted to select among a plurality of parts supply devices 21 arranged on a linearly movable support table 20 the one which stores desired parts. Tapes are used as parts storing means. A parts supply tape 22 shown in FIG. 1 has on its plastic base a line of recesses 23 embossed at a constant pitch to respectively accommodate parts 1, and is covered with a cover tape 24. The parts 1 are delivered to the parts mounting unit 11 by forwarding the parts supply tape 22 one by one pitch while the cover tape 24 is peeled off. The printed circuit board support unit 13 is mainly composed of a two-dimensional moving-table type support device 30 on which a printed circuit board 2 is placed in position. The printed circuit board loading unit 14 includes a loader 40 which pushes out the printed circuit board 2 one by one from a printed circuit board magazine (not shown) which is moved up and down as an elevator, and a loading bridge 41 which carries the pushed-out printed circuit board 2 with a belt (not shown) to the printed circuit board support unit 13. The printed circuit board unloading unit 15 includes an unloading bridge 51 which carries the printed circuit board 2 mounted with parts away with a belt (not shown) from the printed circuit board support unit 13, and an unloader 50 which takes the printed circuit board 2 from the unloading bridge 51 into a printed circuit board magazine (not shown) which is moved up and down as an elevator.

Mounting Unit

The mounting unit 11 is mainly composed of a rotary-index table type support device 60 as shown in FIG. 1. The support device 60 is fixed on the lower end of a rotary shaft 63 supported vertically on a bearing housing 62 of a machine frame 61. The rotary shaft 63 is intermittently rotated in one direction (in the case of this embodiment, clockwise when looking from above) by an index drive device 64 supported on the machine frame 61, thereby the support device 60 rotates intermittently within the horizontal plane. The rotary shaft 63 is hollow and its center cavity forms a vacuum suction path 65 connected to a vacuum source (not shown). The lower end opening of the vacuum suction path 65 is closed by a plug 67 having a plurality of connecting fittings 65 for connecting vacuum hoses. To the connecting fittings 65, the vacuum hoses extending from the vacuum suction device to be described later are connected.

Figure 3:
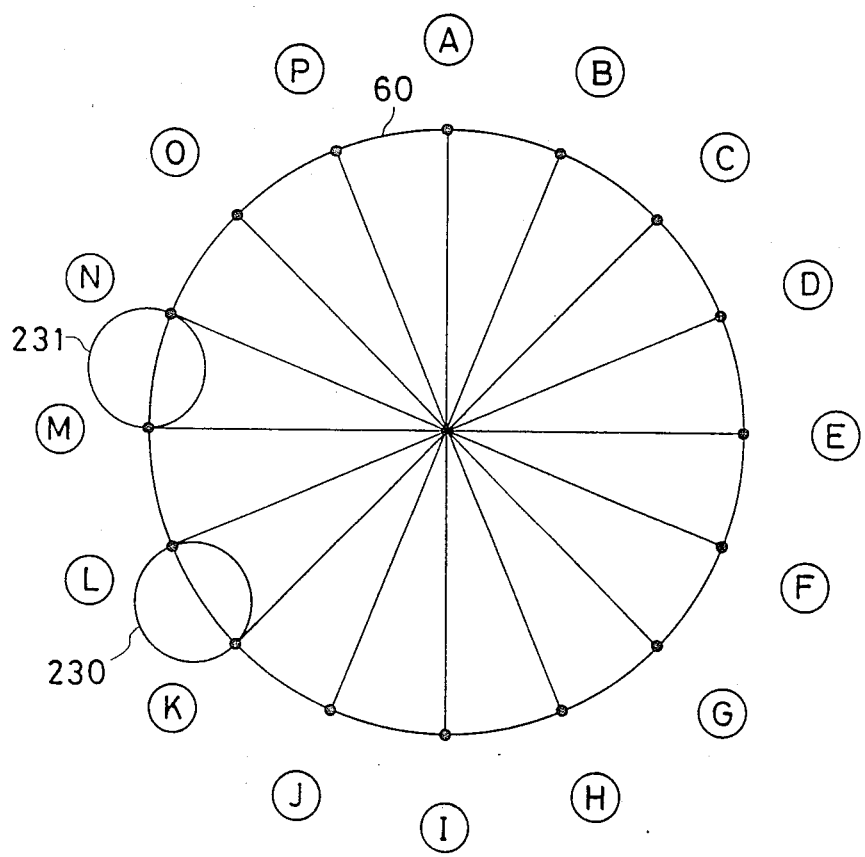
FIG. 3 is a view illustrating an arrangement of work stations.

A unit of an intermittent rotation of the support device 60 is one sixteenth of one rotation, that is, 22.5 degrees. Thus, one point on the periphery of the support device 60 can be stopped at each point of sixteen stop-points while the support device 60 is rotated one turn. According to a usual practice of such a machine, such stop-points are set as work stations. As schematically shown in FIG. 3, the support device 60 (symbolized by a large circle in the figure) is thus provided with sixteen work stations in total as indicated by reference characters from A to P around its periphery. Two small circles respectively intersecting the large circle symbolizing the support device 60 at the work stations K, L and M, N symbolize the suction piece stocker to be described later. The support device 60 carries on its periphery sixteen vacuum suction devices 70 same as the number of division of rotation.

Support of Vacuum Suction Device

Each vacuum suction device 70 is supported on a bearing block 71 secured to the outer fringe of the support device 60 and is moved upward or downward. Two vertical rods 72 and 73 being aligned on a radius of the support device 60 are extended slidably through the bearing block 71, and to the upper and lower ends of these rods 72 and 73, coupling plates 74 and 75 are respectively secured. An outwardly projected portion of the lower coupling plate 75 supports the vacuum suction device 70. The upper coupling plate 74 has an L-shaped form and on both surfaces of its vertically extending section, toward the center of rotation of the support device 60 a roller 76, and toward the opposite direction thereof a roller 77 are mounted respectively. The rollers 76 and 77 are both freely rotatable about the horizontal axes. The numeral 78 denotes an annular cam member secured to the machine frame 61. The roller 76 engages with the cam groove 79 formed on an outer fringe of the cam member 78. This means that a structure 80 including the coupling plate 74, rods 72 and 73, coupling plate 75 and vacuum suction device 70 is suspended from the cam member 78 by the roller 76 and is moved up and down along undulations of the cam groove 79 as the support device 60 rotates. At certain work stations, in order to give a specially large vertical stroke to the vacuum suction device 70 during the quiescent period of the support device 60, descending paths 81 of the roller 76 are diverged from the cam groove 79. At these places, the roller 77 engages with a support member 82 having a "C"-shaped form in section and serves to suspend the structure in lieu of the roller 76, while the cam member 78 does not support the roller 76. The support member 82 is secured to the lower end of a vertical rod 83 to constitute a drive device 84. The rod 83 is supported by a bearing housing 85 secured to the machine frame 61. To the rod 83, descending or ascending motion of strokes necessary at that work station is applied with a drive mechanism, for example, a cam mechanism (not shown) at a proper timing. The roller 76 which ascends after finishing descent is then transferred again to the cam groove 79 by movement of the support device 60. On the other hand, the roller 77 slips out from the support member 82. Such a combination of the descending path 81 and the drive device 84 is provided at the work stations A, D, I, K, L, M and N (see FIG. 4). Meanwhile, in order to keep contacts between the roller 76 or 77 and the support face of the cam groove 79 or support member 82, a tension coil spring 88 is provided between a bracket member 86 projecting horizontally from the upper end of the rod 72 and a stay 87 secured to the support device 60 so as to pull the structure 80 downward by force of the spring. The tension coil spring 88 is extended through a hole 89 formed vertically through the support device 60.

Vacuum Suction Device

Figure 6:
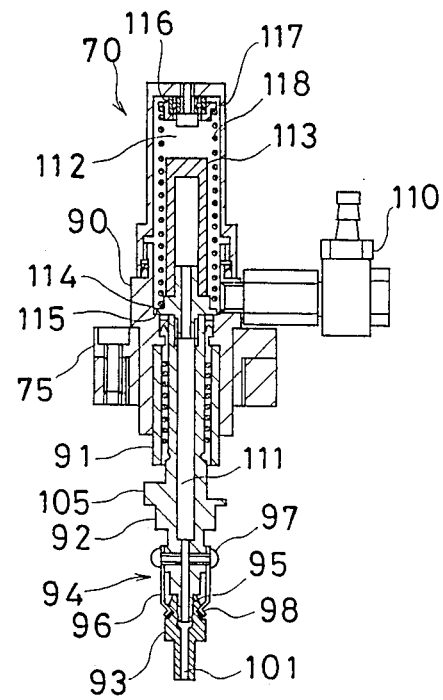
FIG. 6 is a sectional view of a major portion of a vacuum suction device of FIG. 5.
Figure 21:
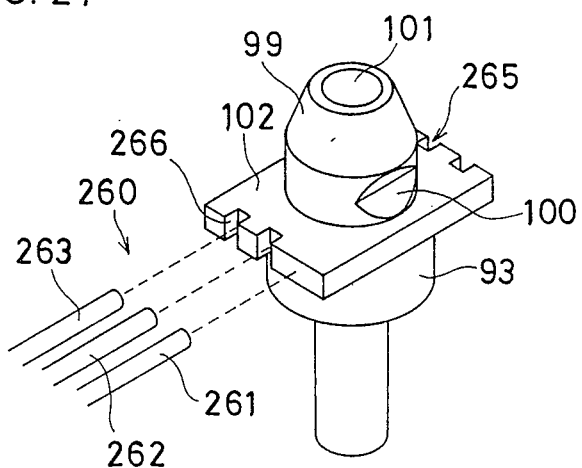
FIG. 21 is a view of a suction piece.

The vacuum suction device 70 is constructed as shown in FIG. 6 with its principal axis vertical. The vacuum suction device 70 has a casing 90 secured to the coupling plate 75. The casing 90 includes at its lower portion a bearing 91 which supports a hollow suction shaft 92 so that the shaft is rotatable about its axis and slidable in a direction of the axis. The lower portion of the suction shaft 92 protrudes downward beyond the bearing 91, and the upper portion thereof enters into a cavity 112 of the casing 90. The lower portion of the suction shaft 92 forms a suction piece attaching portion 94 to which a removable suction piece 93 is attached. The suction piece attaching portion 94 includes a connection tube 95 which mates with the suction piece 93 and a pair of elastic holders 96 which clamp the suction piece 93 from both sides. The elastic holder 96 consists of a strip of leaf spring, and is secured to the suction shaft 92 with a screw 97 at its upper portion, and is formed with a "V"-shaped bent 98 at the lower free end. The vertex of the bent 98 faces the connection tube 95. Though the suction pieces 93 are made by various specifications according to the types and shapes of the parts 1, each of the upper connecting portions of the suction pieces 93 has a common shape. As shown most clearly in FIG. 21, the upper portion of the suction piece 93 is reduced into a taper 99 like a wedge so as to open the elastic holders 96. Under the taper 99, notches 100 with which the bent 98 of the elastic holder 96 is engaged are formed. The upper portion of a center hole 101 of the suction piece 93 is sized to fit to the connection tube 95. Below the level of the notches 100, a flat rectangular flange 102 is formed. On opposite ends of the flange 102, rectangular notches are cut according to a certain rule. Roles of these notches will be described later.

Figure 18:
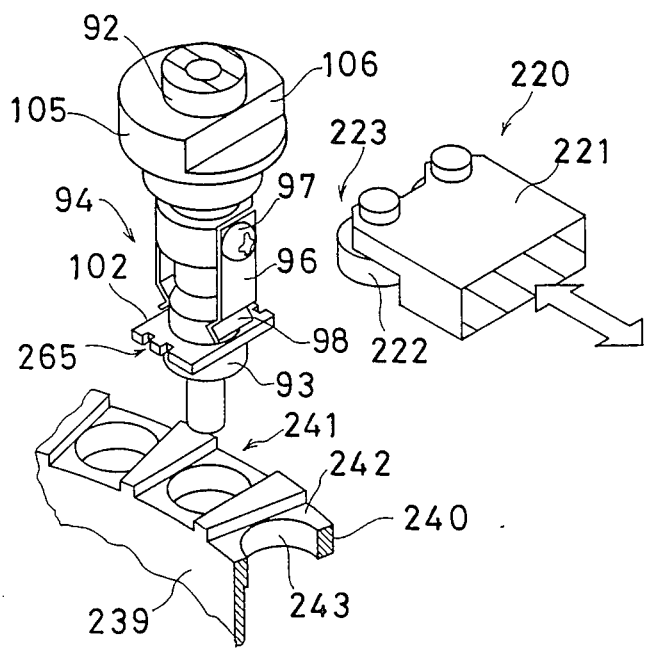
FIG. 18 is perspective views showing a portion of each of a vacuum suction device, suction piece stocker and suction piece angle adjusting device.

The suction shaft 92, as is shown most clearly in FIG. 18, includes a circular flange 105 slightly above the suction piece attaching portion 94. Roles of the flange 105 and a positioning flat 106 thereof will also be described later.

On the side of the casing 90, an elbow-shaped connection fitting 110 is mounted. To the connection fitting 110, a vacuum hose (not shown) is connected, thereby a vacuum path from the center hole 101 of the suction piece 93 through the center hole 111 of the suction shaft 92, and the cavity 112 of the casing 90, and then to the connection fitting 110 is formed. On the upper end of the suction shaft 92, a cap-shaped strainer 113 consisting of a sintered alloy is attached to prevent foreign substances from entering into a deeper portion of the vacuum path. At the level slightly below the portion on which the strainer is secured, the suction shaft 92 has a brake flange 114. Opposing thereto, on the bottom of the cavity 112 of the casing 90, a brake face 115 is formed. On the ceiling of the cavity 112, a rotary seat 117 rotatably supported by a bearing 116 is disposed. A compression coil spring 118 inserted between the rotary seat 117 and the brake flange 114 energizes the suction shaft 92 in an axial direction thereof to press the brake flange 14 against the brake face 115.

Vacuum Switching Valve Assembly

The vacuum hose one end of which is connected to the connection fitting 110 of the vacuum suction device 70 has the other end which is connected to a vacuum switching valve assembly 120 which is disposed on the side of the bearing block 71. Next, constructions of the vacuum switching valve assembly 120 will be described with reference to the drawings in FIG. 5, FIG. 9, FIG. 10, FIG. 11 and FIG. 12. A basic portion of the vacuum switching valve assembly 120 is a protrusion block 121 which is cut out integrally from the bearing block 71. In the protrusion block 121, a horizontal throughhole 122 is formed in a parallel direction with axial lines of the rods 72 and 73. A front cover 124 and a rear cover 125 are fixed to front and rear faces of the protrusion block 121 with bolts 123 to enclose the throughhole 122. A side of the protrusion block 121 is not sufficient to cover the width assigned to the vacuum switching valve assembly 120. In order to supplement such insufficiency, at front and rear of the protrusion block 121, recesses 126 and 127 are formed on the side of the bearing block 71, into which halves of the front cover 124 and rear cover 125 are accommodated. On the rear cover 125, two connection fittings 128 and 129 are provided. The connection fitting 128 is connected to the connection fitting 110 of the vacuum suction device 70 by means of a vacuum hose (not shown). A vacuum hose (not shown) connected to the other connection fitting 129 reaches to the connection fitting 66 of the plug 67 of the rotary shaft 63 through a horizontal throughhole 60a formed in the support device 60 and further again through a vertical throughhole 60b (shown in FIG. 1) formed in the same. It is needless to say that both connection fittings 128 and 129 are in communication with the inside of rear cover 125.

Figure 10:
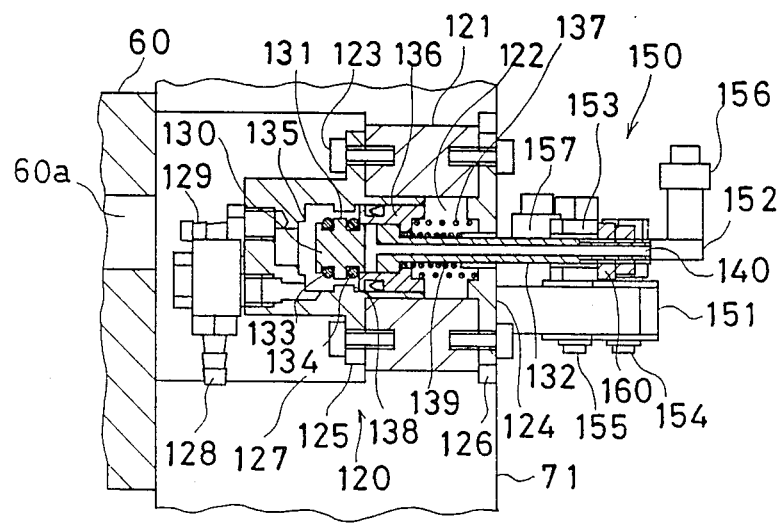
FIG. 10 is a sectional view of a vacuum switching valve assembly taken along the line X—X of FIG. 9, FIG. 11 and FIG. 12 are same plan and sectional views as FIG. 9 and FIG. 10, but showing different operating conditions.
Figure 12:
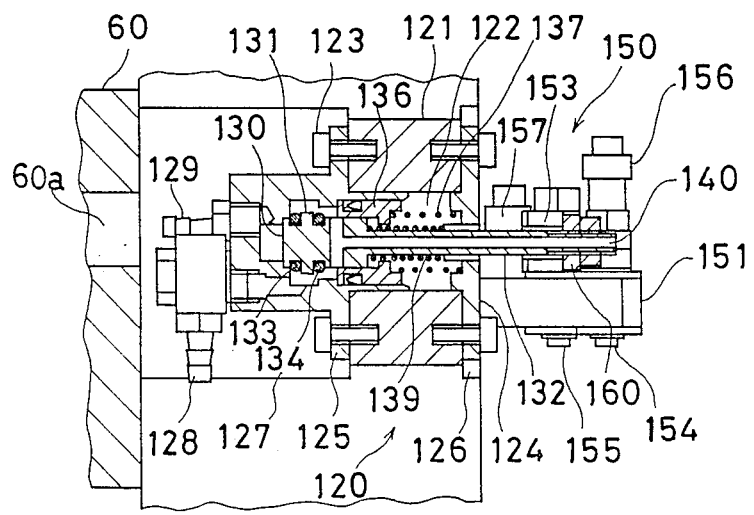

Numeral 130 denotes a valve body which is inserted into the vacuum switching valve assembly 120. The valve 130 is a piston-like member having a main body 131 of a large diameter and a shaft portion 132 of a diameter smaller than that. The main body 131 is positioned mainly in an area belonging to the inside of the rear cover 125 and the shaft portion 132 is extended outward through the front cover 124. On the main body 131 of the valve 130, two seal rings 133 and 134 for air-tight sealing are mounted in axially-spaced relation. The seal ring 133 is for a valve seat 135 on the inner bottom of the rear cover 125, and the other seal ring 134 is for a movable ring valve seat 136 disposed between the valve body 130 and the inner circumferential surface of the rear cover 125. The movable valve seat 136 is pressed against a shoulder portion 138 of the inner surface of the rear cover 125 by a compression coil spring 137 which is inserted between the front cover 124 and the removable valve seat 136. The valve 130 always seals the valve seat 135 with the seal ring 133 due to pressure of a compression coil spring 139 inserted between the main body 131 and the front cover 124. In the shaft portion 132 of the valve 130, an air hole 140 is drilled from its tip end. The air hole 140 is branched into "T"-shape at the position reaching the interior of the main body 131, and is opened to the sides thereof. The valve body side openings of the air hole 140 are out of the movable valve seat 136 and supplies air to the connection fitting 128 when the seal ring 133 is seated on the valve seat 135 as shown in FIG. 12 (at this time, air path between the connection fittings 128 and 129 is shut off). When the valve 130 is pulled out against the pressure of the compression coil spring 139 as shown in FIG. 10, the seal ring 134 is seated on the movable valve seat 136, the connection fittings 128 and 129 are in communication with each other, and the air hole 140 is shut off by the movable valve seat 136.

Valve Switching Device

Figure 9:
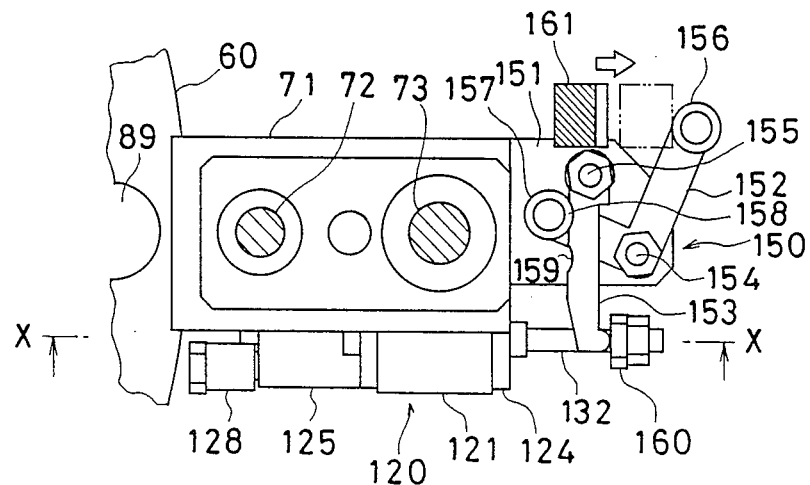
FIG. 9 is a plan view of a vacuum switching valve assembly and a valve switching device.
Figure 11:
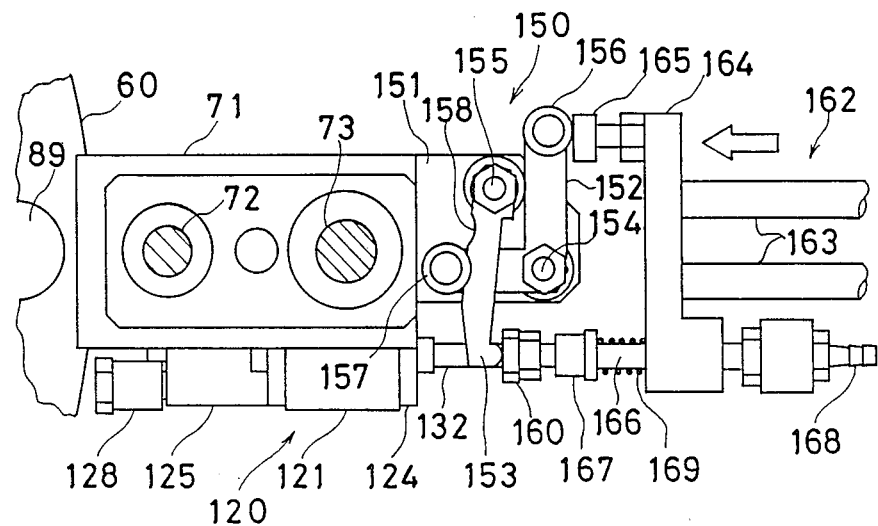

To the vacuum switching valve assembly 120, a valve switching device 150 for changing-over and maintaining a valve position is attached. The valve switching device 150 is assembled on a shelf portion 151 which is integrally cut out on the front surface of the bearing block 71. On the shelf portion 151, a bell crank 152 and a lever 153 are pivoted with studs 154 and 155 so as to swing within horizontal planes. The bell crank 152 has rollers 156 and 157 at both ends. The roller 156 is, as is apparent from FIG. 10, supported at the position higher than the top of the studs 154 and 155, and the roller 157 and the pivot shaft thereof. The roller 157, according to an angle of the bell crank 152, engages with either one of shallow concavities 158 and 159 formed on the side of the lever 153 in spaced relation with each other. The tip end of the lever 153 engages with the rear side of a flange 160 (constituted by so-called double nuts) formed on the shaft end of the valve 130 of the vacuum switching valve assembly 120. As shown in FIG. 9, when the roller 157 of the bell crank 152 engages with the concavity 158 of the lever 153, the valve 130 is pulled out from the vacuum switching valve assembly 120 by the lever 153, opening the vacuum suction path. As shown in FIG. 11, when the roller 157 engages with the concavity 159, the valve 130 is retracted into the vacuum switching valve assembly 120 by the force of the compression coil spring 139, intercepting the vacuum suction path. Both states of the valve assembly are maintained without any power supply during travel of the vacuum suction valve assembly 120 on the support device 60, due to resistance against escape of the roller 157 out from the concavity 158 or 159.

It is a switching actuator 161 which shifts the vacuum switching valve assembly 120 and valve switching device 150 from the state in FIG. 11 to the state in FIG. 9. The switching actuator 161 is, in brief, just like a leg which kicks the roller 156, and with a drive source (not shown), moves linearly or swings from the position shown by solid lines to the position shown by two-dotted lines in FIG. 9. The switching actuator 161 pushes the roller 156 to rotate the bell crank 152 clockwise when looking from above so that the roller 157 which hitherto has been engaged with the concavity 159 is moved to the concavity 158, and an angle of the lever 153 is changed. The switching actuator 161 is disposed at the work station A. The switching actuator 161 waits for the valve switching device 150 to come to the work station A. Since the roller 156 is at the highest level within the valve switching device 150 as aforementioned and the lower end of the switching actuator 161 keeps the same height, no interference occurs between the switching actuator 161 and the valve switching device 151.

It is a switching actuator 162 which shifts the vacuum switching valve assembly 120 and valve switching device 150 from the state of FIG. 9 to the state of FIG. 11. In the embodiment, the stitching actuator 162 is constructed as follows. Numeral 163 denotes a pair of rods which are subjected to slide horizontally by a drive source (not shown), and on the tip ends thereof, a coupling plate 164 is secured. The coupling plate 164 supports a pusher 165 and an air injection nozzle 166. The air injection nozzle 166 has at its front end a mouth piece 167 consisting of an elastic substance such as rubber or the like, and at its rear end a connection fitting 168 to which a compressed-air hose (not shown) is connected. The air injection nozzle 166 is slidable with respect to the coupling plate 164 and biased toward the front end by means of a compression coil spring 169. When the switching actuator 162 approaches the valve switching device 150, the pusher 165 pushes the roller 156 to rotate the bell crank 152 counter-clockwise when looking from above, and the roller 157 which has been engaged with the concavity 158 is moved to the concavity 159 to change the angle of the lever 153. At this time, the air injection nozzle 166 presses the mouth piece 167 against the shaft 132 of the valve 130 under the pressure of the compression coil spring 169 and injects the compressed-air through the air hole 140. Since the air path to the connection fitting 129 is sealed by the seal ring 133 at this time, the compressed-air being injected into the rear cover 125 of the vacuum switching valve assembly 120 flows only to the connection fitting 128. The compressed-air positively terminates the vacuum inside the vacuum suction device 70 and serves to completely stop suction of the suction shaft 92. The switching actuator 162 is disposed at work stations I and J.

Work Stations

The mounting unit 11 constructed as described above moves its vacuum suction devices 70 intermittently from one work station to the other on their respective closed-loop paths. At the work stations from A to P, various devices are arranged as mixing idle stations which do not act particularly relative to the vacuum suction devices 70. In the following, devices located at each work station will be described. Here, some of the work stations will be specially designated to indicate the content of works to be performed therein. That is, the work station A is named a parts supply station, work station C suction shaft adjusting station, work station D parts orienting station, work station F parts recognition station, work station I parts mounting station, work station J dump station, work station K and M suction piece detaching station, working station L and N suction piece attaching station, and work station O suction piece recognition station. The other stations are idle stations.

Parts Supply Station

The parts supply station A gives a place for the parts supply unit 12 described in the paragraph of "General Configuration".

Suction Shaft Angle Adjusting Station

Figure 7:
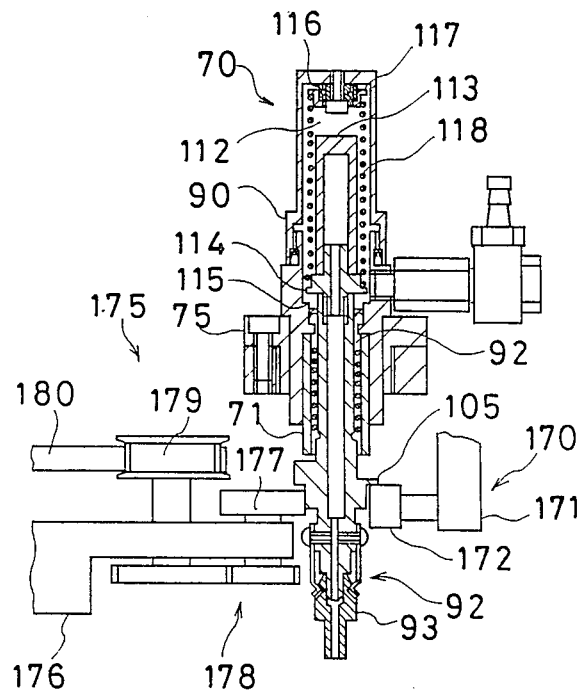
FIG. 7 is a sectional view of the portion of a vacuum suction device similar to FIG. 6, wherein a brake release device and a suction shaft angle adjusting device are shown.

At the suction shaft angle adjusting station C, a brake release device 170 and a suction shaft angle adjusting device 175 are disposed (see to FIG. 7). The brake release device 170 includes an arm 171 which is moved within the space by a drive device (not shown), and a roller 172 supported at the end of the arm 171 rotatably about the horizontal axis. The suction shaft angle adjusting device 175 includes a slider 176 which is subjected to slide horizontally by a drive device (not shown), and a friction wheel 177 supported on the slider 176. The friction wheel 177 is rotatable about the vertical axis and coupled to an electric motor (not shown) through a power transfer train including a gear train 178, a timing pulley 179, a timing belt 180 and so on. In the case where the suction shaft 92 has come to be changed its angle, the flange 105 is raised by means of the roller 172 of the brake release device 170 to rise the brake flange 114 from the brake face 115. In this state, the suction shaft angle adjusting device 175 approaches the suction shaft 92, and the friction wheel 177 comes into contact with the suction shaft 92 at a point slightly below the flange 105 to rotate the suction shaft 92 by a desired angle. After the completion of rotation of the suction shaft 92, the suction shaft angle adjusting device 175 is left from the suction shaft 92, and the brake release device 170 is lowered to make the brake flange 114 contact with the brake face 115 so as to prevent the suction shaft 92 from rotating freely. If the brake release device 170 is located at the position where the roller 172 does not interfere the path of the suction shaft 92, brake releasing action can be performed merely by the up-and-down motion of the brake release device 170 without adding approaching and leaving motions thereof to and from the suction shaft 92.

Parts Orienting Station

Figure 8:
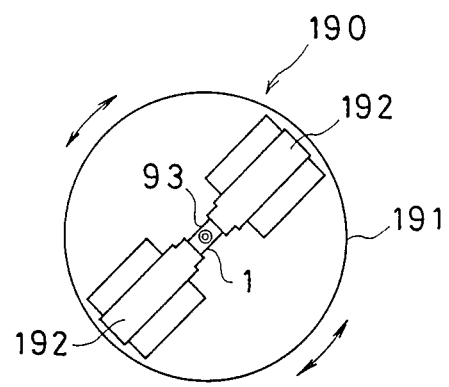
FIG. 8 is a plan view of a parts orienting device.

At the parts orienting station D, a parts orienting device 190 is disposed, whose outline is shown in FIG. 8. Numeral 191 denotes a rotary disc which is rotated about the vertical axis by an electric motor (not shown). It is oriented at a desired angle in a certain angle unit, for example, the unit of 1 degree. The rotary disc 191 supports a pair of orienting jaws 192 on its upper surface. The orienting jaws 192 are supported symmetrically and slidably linearly, approaching to or departing from the center of the rotary disc 191 by means of a drive device (not shown). End faces of the orienting jaws 192 clamp the part 1 and are finished accurately at right angles to the moving direction thereof.

Parts Recognition Station

Figure 4:
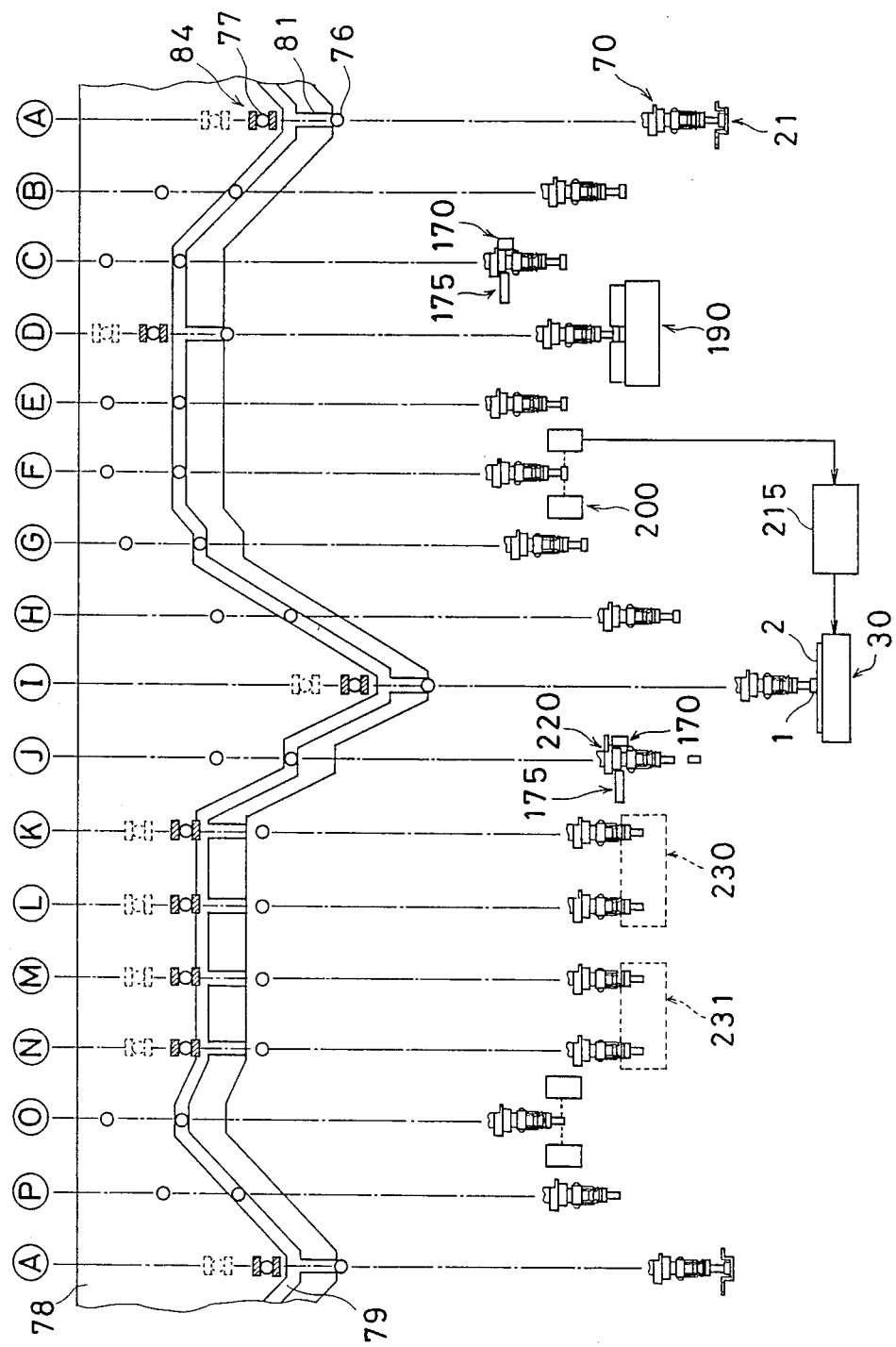
FIG. 4 is an expanded view illustrating behavior of a vacuum suction device at each work station.
Figure 5:
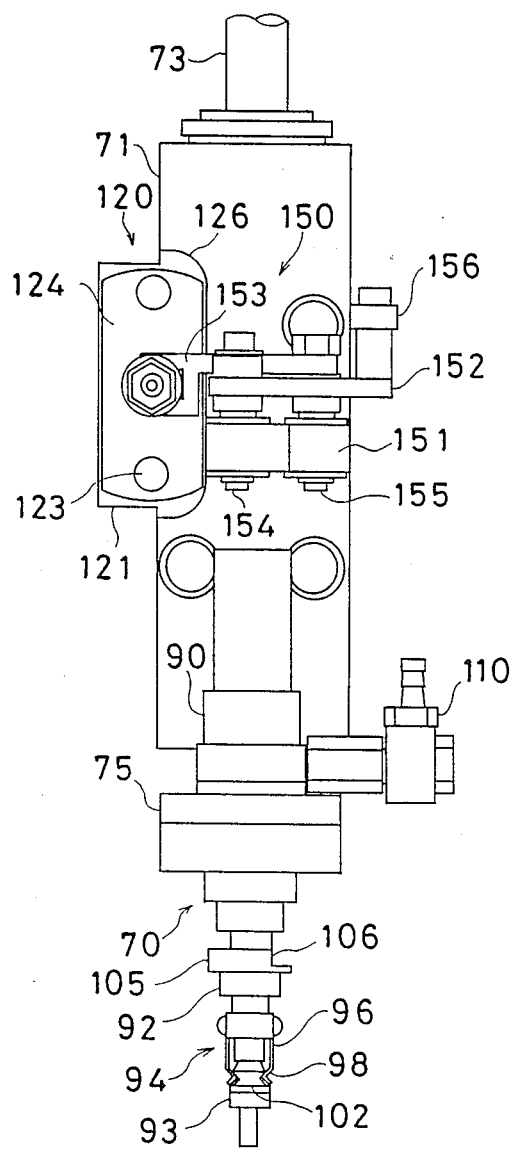
FIG. 5 is a front view of a major portion of a vacuum suction device.
Figure 23:
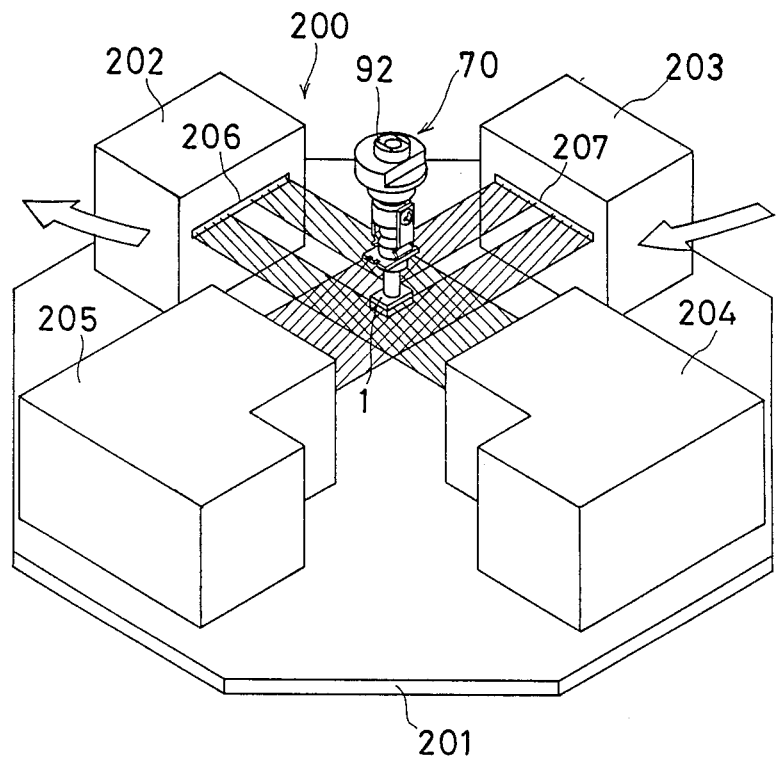
FIG. 23 is a perspective view of a parts recognition device.
Figure 24:
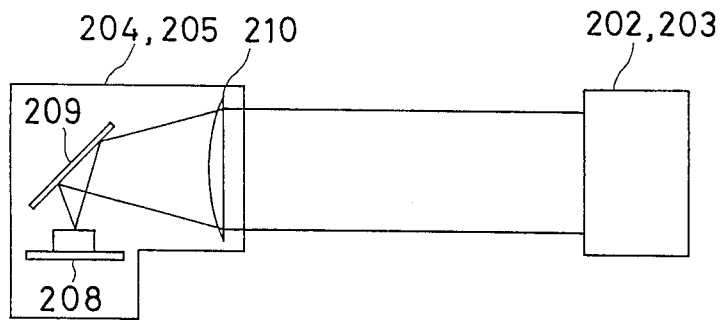
FIG. 24 is a view illustration an irradiation mechanism of an irradiation unit relative to an optical sensor.

At the parts recognition station F, a parts recognition device 200 is disposed. The parts recognition device 200 is constructed as shown in FIG. 23 to be described in the following. Numeral 201 denotes an elevator whose height is adjustable by a drive device (not shown). On the upper surface of the elevator 201, two optical sensors 202 and 203 and two irradiation units 204 and 205 are secured. The optical sensor 202 and irradiation unit 204 make a pair, and the optical sensor 203 and irradiation unit 205 make another pair. The optical sensors 202 and 203 are located at right angles to each other, and the irradiation units 204 and 205 face their pair-mate, respectively. The optical sensors 202 and 203 have a number of light sensitive elements aligned inside light receiving windows 206 and 207 which are long in a horizontal direction and located at the same height. The irradiation units 204 and 205 irradiate wide parallel light beams to the light receiving windows 206 and 207. Such parallel light beams can be obtained as schematically shown in FIG. 24, by paralleling laser beam emitted from a semiconductor laser 208 with a reflection mirror 209 and a lens 210. The parallel light beams emitted from the irradiation unit 204 and irradiation unit 205 intersect to each other orthogonally. The vacuum suction device 70 (in FIG. 23, only the end portion of the suction shaft 92 is shown) from the work station E passes through the gap between the optical sensor 203 and irradiation unit 204, and intrudes into a circle being formed therebetween, and stops at a center of such a circle to expose the part 1 to the intersecting parallel light beams. The optical sensors 202 and 203 measure width and position of the part 1 through projected silhouettes of the part 1. Measured data are sent to a control device 215 which is schematically shown in FIG. 4. The control device 215 finds deviation in position and direction of the part 1 in accordance with the measured data of shape and position of the part 1 known in advance as they should be. The control device 215 gives a position correcting command to the printed circuit board support device 30 for which moving and positioning programs are provided on the assumption that the part 1 should take an ideal position. Meanwhile, it is to be understood that the control device 215 is not only for recognizing the part 1 and movement of the printed circuit board support device 30 but also for symbolizing control function of the whole apparatus. After recognition of the part 1 is finished, the vacuum suction device 70 passes through the gap between the optical sensor 202 and irradiation unit 205 and proceeds to the work station G.

The part 1 sucked by the vacuum suction device 70 and carried into the part recognition station F should be in the proper posture suitable for being placed on the printed circuit board 2, but sometimes, the vacuum suction device 70 sucks the wrong side of the part 1. This is caused by jumping up of the part 1 due to feeding movement of the parts supply tape 22. The part 1 sucked in an abnormal posture must be eliminated. Whether or not the part 1 is in proper posture is judged from the data obtained by the optical sensors 202 and 203. More specifically, when the silhouettes of the part 1 are projected on the optical sensors 202 and 203, data of position and length of the silhouettes are obtained, and the circumferential length (in a horizontal direction) of the part 1 comes to be known from the data. Usually there is an obvious difference between the data obtained in the case of normal posture and the data in the case of abnormal posture, thereby the normality and abnormality can be readily distinguished from each other. As it is rare that a part has a shape which forms small difference in its circumferential length between the cases of normal posture and abnormal posture, namely, a part of a cubic shape can be hardly seen, this technique for judgment is effective. When judging the part posture abnormal, the control device 215 excludes that part from the object to be mounted. That is, the control device gives signals to the drive device 84 and switching actuator 162 disposed at the parts mounting station I so as not to lower the vacuum suction device 70 at this station and not to allow it to finish suction of the part.

Parts Mounting Station

At the parts mounting station I, the printed circuit board support unit 13 described in the paragraph of "General Configuration" is arranged. On the printed circuit board 2 supported by the support device 30, adhesive is applied at desired positions.

Dump Station

At the dump station J, the switching actuator 162 and a box (not shown) for receiving the part 1 dropped from the vacuum suction device 70 are arranged. Likewise the suction shaft angle adjusting station C, the brake release device 170 and the suction shaft angle adjusting device 175 are arranged. Additionally, a suction piece angle adjusting device 220 is disposed at this station. Major portions of the suction piece angle adjusting device 220 are shown in FIG. 18, wherein a roller cluster 223 including two rollers 222 being aligned horizontally is mounted at the end of a slider 221. The slider 221 is moved reciprocally and horizontally by means of an actuator (not shown). The roller cluster 223 is pressed against the periphery of the flange 105 of the suction shaft 92 by a force of a spring 224 symbolically shown in FIG. 19 or FIG. 20. Operation of the suction piece angle adjusting device 220 will be described in the next paragraph since it is associated with the construction of a suction piece stocker to be described next.

Suction Piece Detaching Station, Suction Piece Attaching Station

In the present embodiment, a single suction piece stocker 230 is disposed across the suction piece detaching station K and suction piece attaching station L, and another suction piece stocker 231 is disposed across the suction piece detaching station M and suction piece attaching station N. The suction piece stockers 230 and 231 have the same construction, so here the suction piece stocker 230 is adopted as representative of the both, and its construction will be described with reference to FIG. 13 through FIG. 17. Numeral 232 denotes a lower deck secured to the machine frame 61. An upper deck 233 is supported on the lower deck 232 by four posts 234. The posts 234 are not shown in FIG. 14 not to obstruct the view. The lower deck 232 and upper deck 233 respectively retain bearings 235 and 236, thereby a hollow rotary disc 237 is supported rotatably about the vertical axis. The rotary disc 237 serves as a timing pulley which is connected by a timing belt 238 whose existence is shown by one-dotted lines to an electric motor (not shown) through which rotation of desired angle is given. To the rotary disc 237, a crown-shaped holder 239 is secured. The holder 239 has on the upper end a flange 240 on which a plurality of suction piece holders 241 are formed at a constant spacing. Such a suction piece holder 241 includes a shallow groove 242 into which the flange 102 of the suction piece 93 is accommodated, and a throughhole 243 into which a stem portion of the suction piece 93 enters. Numeral 244 denotes a bridge secured to the lower deck 232. A block 245 is located in the center of the rotary disc 237 and secured on the bridge 244. On the top of the block 245, a bracket 246 is secured, and facing the tip end of the bracket 246, a block 247 is stood on the upper deck 233. The suction piece detaching station K has its center between the bracket 243 and the block 247. The bracket 246 and the block 247 support a detaching device 248. The detaching device 248 includes a pair of claws 249 mounted oppositely on the bracket 246 and the block 247 so as to be rotatable in the vertical plane, and compression coil springs 250 which biases the tip ends of the claws 249 to each other. A space between the tip ends of the claws 249 is slightly narrower than the longitudinal dimension of the flange 102 of the suction piece 93. To the sides of the bracket 246 and block 247, brackets 251 and 252 are secured, onto which a light emitting portion 254 and a light receiving portion 255 of a photo-coupler type optical sensor 253 are provided. The optical sensor 253 checks the presence or absence of the suction piece 93 in the suction piece holder 241 located at a center of the suction piece detaching station K, thereby such accident as the suction piece 93 is forced into the suction piece holder 241 which has been already occupied can be prevented.

As previously described, the suction piece stocker 230 lies across the suction piece detaching station K and suction piece attaching station L, an identification device 260 is disposed at the latter station. The identification device 260 includes three reflection-type optical sensors. In the figure, only optical fiber elements (each includes a metal tube containing a wad of optical fibers) possessing both the light emitting portion and light receiving portion are shown and denoted at numerals 261, 262 and 263. End portions of the optical fiber portions 261, 262 and 263 are retained by a holder 264 in the horizontally-aligned relationship at a prescribed space. The holder 264 is secured to the upper block 233. The identification device 260 is at the same level as the flange 102 of the suction piece 93 supported by the holder 239, and serves to read type-identification marks 265 (see FIG. 21) formed on both ends of the flange 102. The type-identification marks 265 are, as referred to in the paragraph of "Vacuum Suction Device", constituted by notches 266 cut in the end of the flange 102. There are three portions on which the notches 266 are to be cut, and the spaces therebetween are similar to the spaces between the optical fiber elements 261, 262 and 263.

On the bridge 244, another reflection-type optical sensor 270 is secured. The optical sensor 270 is opposite to a ring portion 271 formed in the rotary disc 237 and recognizes the presence of notches 272 being cut at prescribed positions of the ring portion 271. Thereby, the rotating position of the rotary disc 237 can be known.

Figure 13:
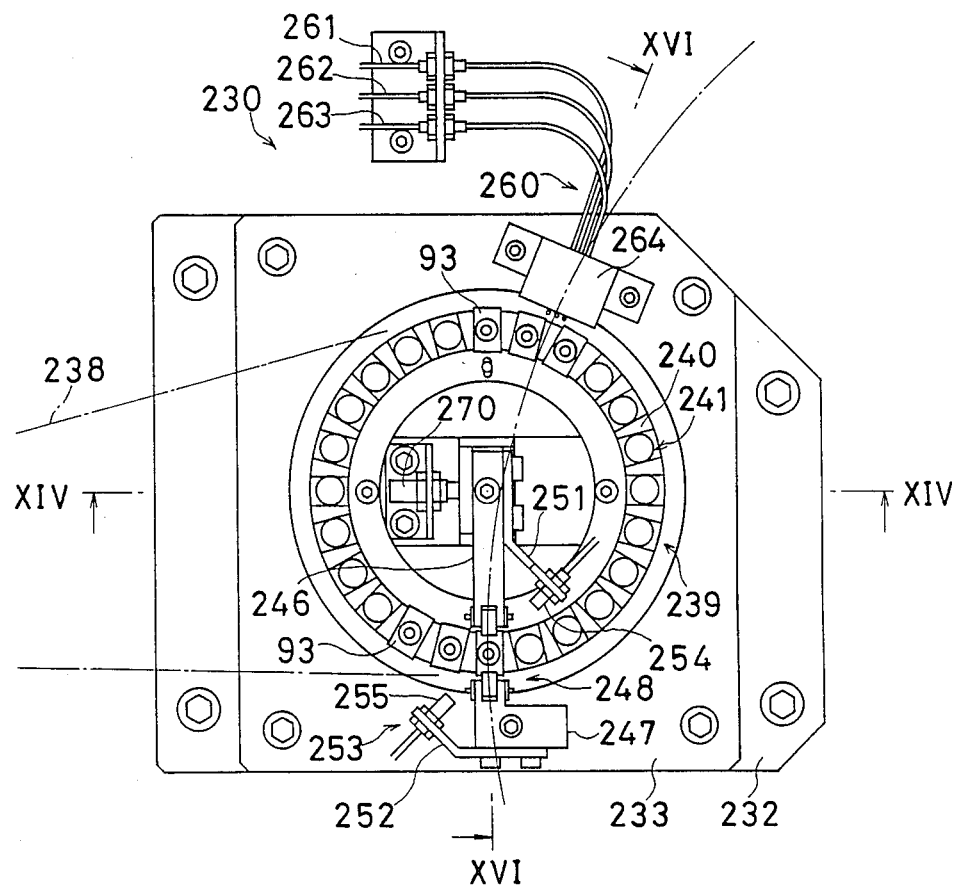
FIG. 13 is a plan view of a suction piece stocker.
Figure 14:
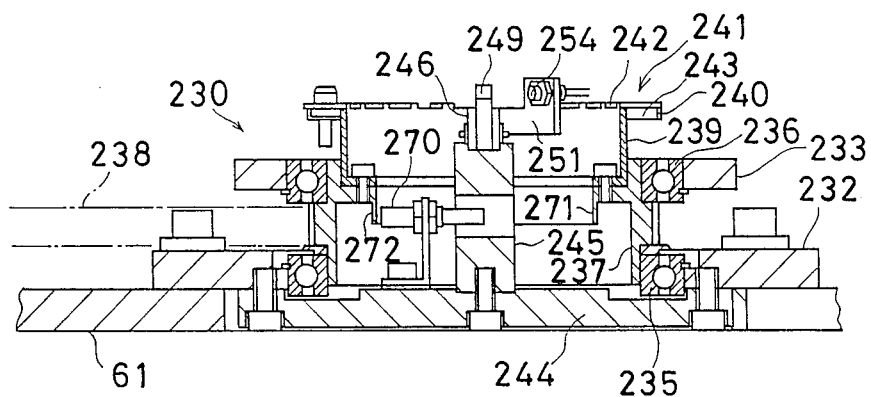
FIG. 14 is a sectional view of a suction piece stoker taken along the line X IV—X IV of FIG. 13.
Figure 15:
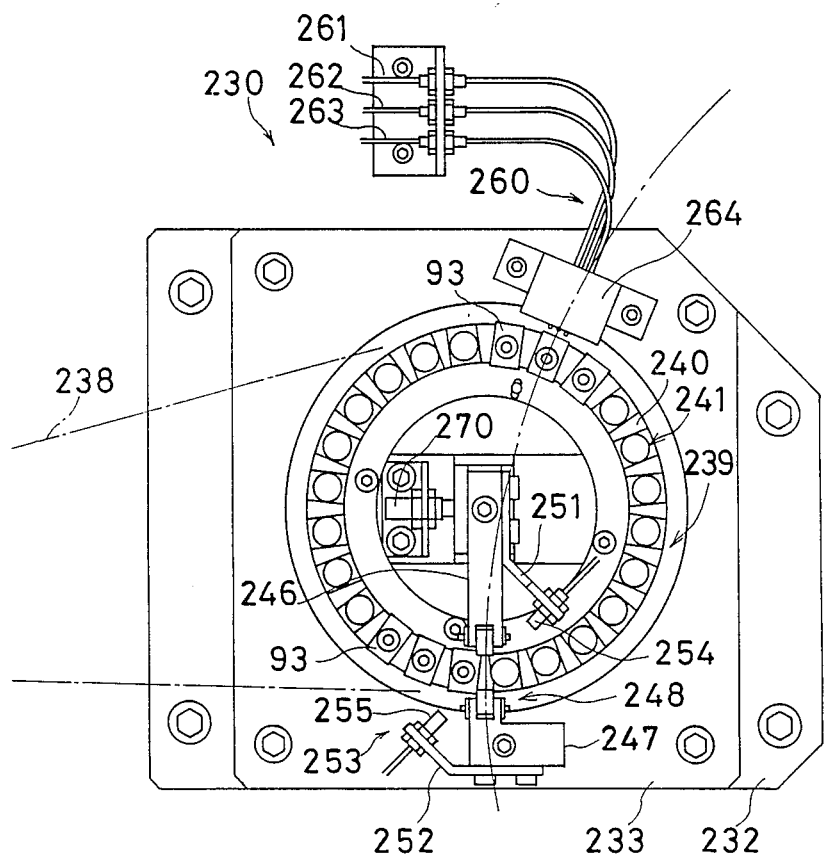
FIG. 15 is a plan view of a suction piece stoker in the operating condition different from FIG. 13.
Figure 19:
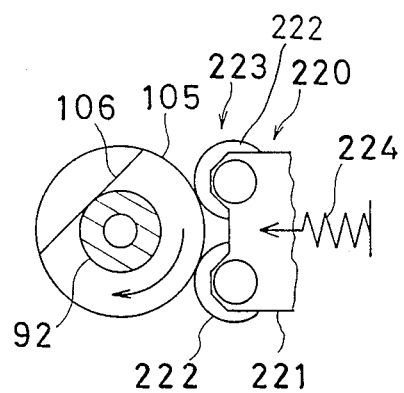
FIG. 19 and FIG. 20 are views illustrating operation of a suction piece angle adjusting device.
Figure 20:
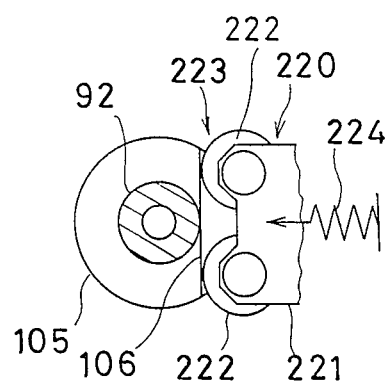

The suction piece stocker 230 has a plurality of suction piece holders 241 arranged along a circle which is a kind of closed-loop, and such an arrangement loop of the suction piece holder 241 is movable along its loop and crossed the path loop of the vacuum suction device 70 at different height or level. At the suction piece detaching station K and the suction piece attaching station L which are the crossing point, the drive device 84 is disposed as previously described which lowers the vacuum suction device 70 from the path loop to contact with the suction piece stocker 230. Now, on the suction piece detaching station K, an empty suction piece holder 241 is positioned right under the vacuum suction device 70, and the suction piece 93 is transferred from the vacuum suction device 70 to the suction piece holder 241. Note that the groove 242 of the suction piece holder 241 is arranged in such a manner that its longitudinal direction is aligned with a radius of the holder 239, and at this station, as it is seen in FIG. 13, the longitudinal direction of the groove 242 is aligned with the tangential direction of the path loop of the vacuum suction device 70. In order to orient the direction of the suction piece 93 to the direction of the groove 242, the suction piece angle adjusting device 220 is disposed at the dump station J. More specifically, as shown in FIG. 19, when the suction shaft 92 is rotated with the suction shaft angle adjusting device 175 toward the angle origin which is an angle in which the flange 102 of the suction piece 93 is aligned with the groove 242 of the suction piece holder 241, while the roller cluster 223 is pressed against the flange 105 of the suction shaft 92, the roller cluster 223 finally engages with the positioning flat 106 of the flange 105, and the suction shaft 92 is stopped with its suction piece 93 exactly aligned with the angle origin. Thereafter, the suction shaft angle adjusting device 175 and the suction piece angle adjusting device 220 are detached from the suction shaft 92 in this order. In addition, the brake release device 170 which has been lifting the suction shaft 92 during its rotation is lowered to bring the suction shaft 92 again into the braking state. An operation of the suction shaft angle adjusting device 175 may be accomplished by rotating the suction shaft 92 by the angle roughly calculated in advance and thereafter leaving the suction shaft 92 free to be adjusted by the roller cluster 223, or by rotating the friction wheel 177 by a fixed angle at each time so as to bring the suction shaft 92 in alignment with the angle origin and thereafter slip the friction wheel 177, or by monitoring an electric current value of the electric motor for driving the friction wheel 177 and stopping the motor at a moment when the standstill of suction shaft 92 is recognized in accordance with change in such an electric current.

Figure 16:
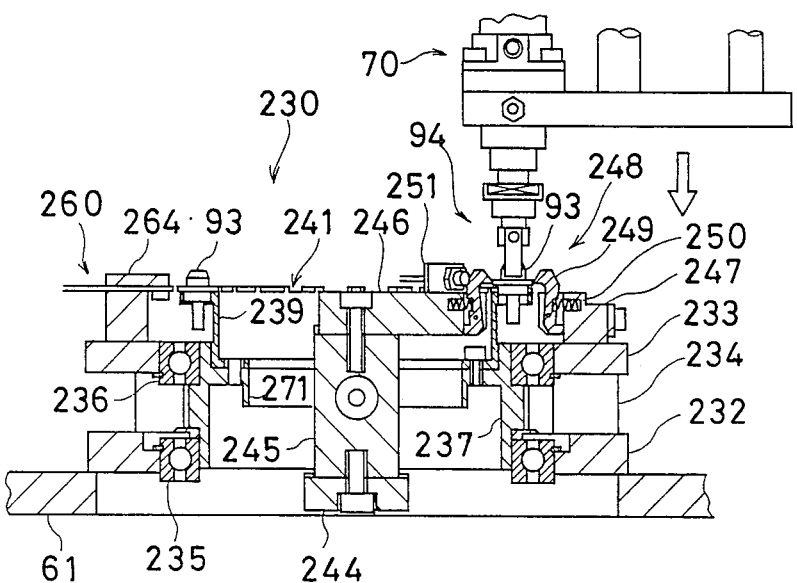
FIG. 16 is a sectional view taken along the line XVI—XVI of FIG. 13.
Figure 17:
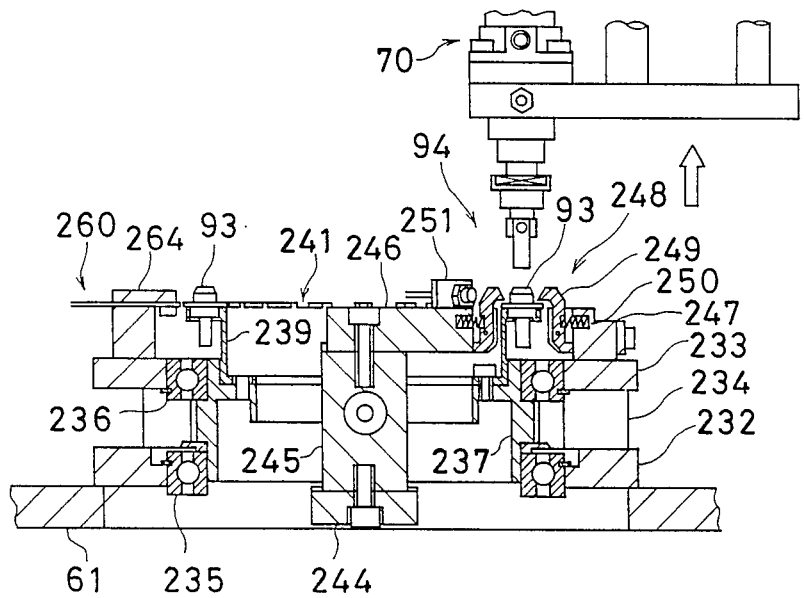
FIG. 17 is a same sectional view as FIG. 16 of a different operating condition.

After returning the suction shaft 92 whose angle has been adjusted at the suction shaft angle adjusting station C to the angle origin in a manner mentioned above, the vacuum suction device 70 is lowered at the suction piece detaching station K to make the flange 102 of the suction piece 93 push the claws 249 of the detaching device 248 open as shown in FIG. 16 so that tip ends of the claws 249 are engaged with the upper surface of the flange 102. When the vacuum suction device 70 is raised from the suction piece stocker 230 in the following operation, the suction piece 93 detained by the claws 249 is detached from the vacuum suction device 70 and remains in the suction piece holder 241 (see FIG. 17).

The vacuum suction device 70 which has lost the suction piece 93, at the suction piece attaching station L, picks up another suction piece 93 to be used for the next parts mounting operation from the suction piece stocker 230. Picking up of the suction piece 93 can be performed by just approaching the vacuum suction device 70 to the suction piece stocker 230 and thereafter separating it from the suction piece stocker 230. By approaching the vacuum suction device 70 to the suction piece stocker 230, the connection tube 95 of the vacuum suction device 70 mates with the suction piece 93 and the elastic holders 96 engage with the notches 100 of the suction piece 93. When the vacuum suction device 70 begins to leave from the suction piece stocker 230, the suction piece 93 is pulled out from the suction piece holder 241 as it is. In order to supply the suction piece 93 necessary for the vacuum suction device 70, the suction piece stocker 230 is rotated during movement of the vacuum suction device 70 from the suction piece detaching station K to the suction piece attaching station L to carry a desired suction piece 93 to the suction piece attaching station L. What is to be noted here is a relationship between a position of the suction piece holder 241 at the suction piece detaching station K and a position of the suction piece holder 241 at the suction piece attaching station L. Such an arrangement of the suction piece holders 241 prevents two suction piece holders 241 from simultaneously coinciding with the centers of the suction piece detaching station K and the suction piece attaching station L (see FIG. 13 and FIG. 15). Therefore, the angle of the suction piece stocker 230 is adjusted in such a manner that one suction piece holder 241 coincides only with the suction piece detaching station K when detaching the suction piece and that one suction piece holder 241 coincides only with the suction piece attaching station L when attaching the suction piece.

Figure 22:
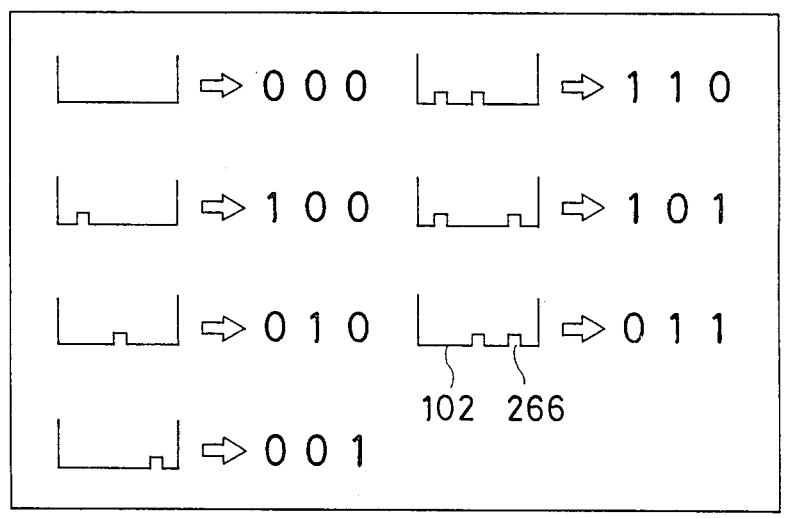
FIG. 22 is a view illustrating type-identification marks formed on a suction piece.

The identification device 260 reads type-identification marks 265 on the suction piece 93 held by the suction piece stocker 230 and transmits its information to the control device 215. The control device 215 in turn stores the information in a memory and reads the same when proceeding operation of the apparatus according to the program. The type-identification marks 265 are formed by utilizing the fact that the identification device 260 recognizes the notch 266 as the dark position. Therefore, in the embodiment shown, presence or absence of the notch 266 corresponds to "1" or "0" of binary code, and thus seven types of suction pieces can be defined by three-bit marks as shown in FIG. 22. In addition, there is no mark consisting of three notches 266 because the identification device 260 tends to receive information that the suction piece holder 241 is empty if all of the optical fiber elements 261, 262 and 263 sense darkness. Reading of the type-identification marks 265 is performed for all suction pieces 93 being held by the suction piece stocker 230 before starting operation of the parts mounting apparatus 10, and operation sequences are constructed according to the result. The identification device 260 may also be used to identify type of the suction piece 93 attached to the vacuum suction device 70, if its installing location is appropriately changed.

Suction Piece Recognition Station

Figure 25:
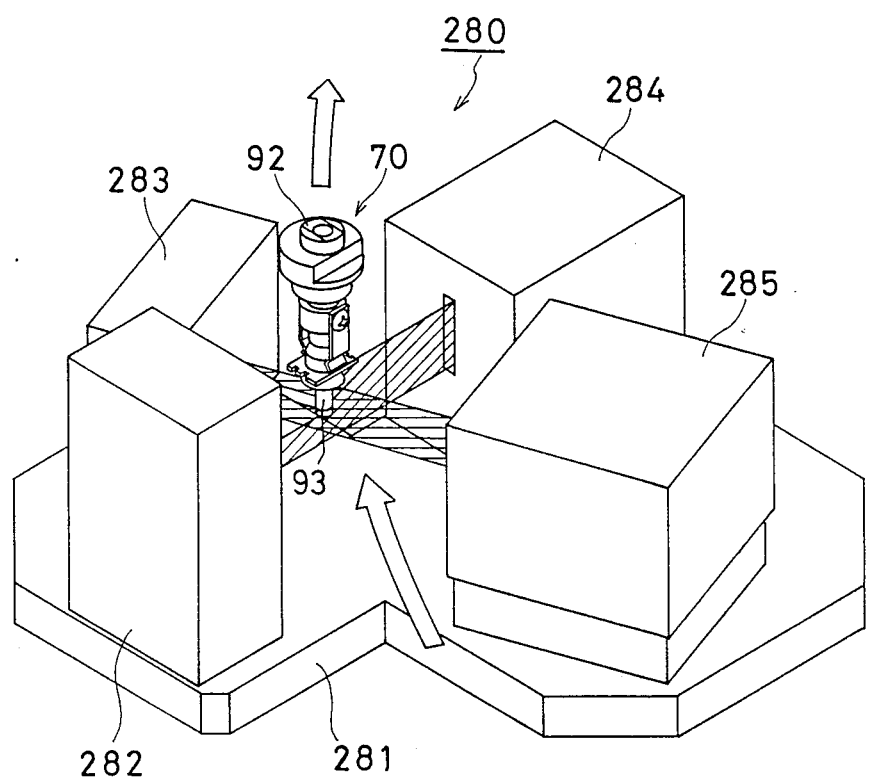
FIG. 25 is a perspective view of a suction piece recognition device.

On the suction piece recognition station O, a suction piece recognition device 280 is disposed. The suction piece recognition device 280 is constructed as shown in FIG. 25 and described in the following. Numeral 281 denotes a stationary deck on which two optical sensors 282 and 283 and two irradiation units 284 and 285 are secured. The optical sensor 282 and the irradiation unit 284 make a pair, and the optical sensor 283 and the irradiation unit 285 make another pair. The optical sensors 282 and 283 are arranged at right angles to each other, and the irradiation units 284 and 285 face their pair-mate, respectively. Though configurations of the optical sensors 282 and 283 and the irradiation units 284 and 285 are similar to those of the optical sensors 202 and 203 and the irradiation units 204 and 205 disposed at the parts recognition station F, they are different from the parts recognition device 200 in that a light receiving window of the optical sensor 282 is long in a vertical direction and an irradiation slit of the irradiation unit 284 is opened in a vertical direction. Parallel light beams emitted from the irradiation unit 284 and the irradiation unit 285 intersect orthogonally to each other, and the vacuum suction device 70 (in FIG. 23, only the end portion of the suction shaft 92 is shown) which has passed through a gap between the optical sensor 282 and irradiation unit 285 and intrudes into a circle being formed therebetween, and stops at a center of such a circle to expose the suction piece 93 to the intersection of light beams. The suction piece 93 is just heading for the parts mounting operation and the height of its end is measured before its departure by the optical sensor 282. On the basis of measured result, the elevator 201 at the parts recognition station F moves upward and downward to adjust the measured height of the part 1. It will be appreciated that movement of the elevator 201 is started at a time point when the suction piece 93 the end height of which has been judged not to be suitable for recognition of the part 1 arrives at the parts recognition station F. The optical sensor 283 measures the thickness of the suction piece 93, and on the basis of measured value, a type of suction piece 93 is identified or recognized.

General Operations

Angle of the suction shaft 92 of the vacuum suction device 70 which has sucked the part 1 at the part supply station A is adjusted at the suction shaft angle adjusting station C to the angle of the part 1 to be required at the parts mounting station I. Since precise orientation of the part 1 is not necessary at this stage, only a rotation of the suction shaft 92 may be done roughly. This means that slip of the friction wheel 177 is to some extent allowed. The vacuum suction device 70 arrives next to the parts orienting station D. In here, the parts orienting device 190 has been directed in a prescribed direction and has been waiting for arrival of the vacuum suction device 70 with the orienting jaws 192 in the opened state. When the orienting jaws 192 pinch the part 1 being lowered, the angle thereof is now precisely set. Thereafter, a positional aberration of the part 1 relative to the vacuum suction device 70 is measured at the parts recognition station F. Also, identification on whether or not the sucked part is in the proper posture is performed here. The vacuum suction device 70 departing the parts recognition station F is directed to the parts mounting station I, wherein the part 1 is pressed against the printed circuit board 2 whose position has been corrected according to positional aberration data of the part 1 and stuck to the adhesives applied thereon, thereafter ascending as leaving the part 1. When the posture of the part 1 being sucked is not proper, the vacuum suction device 70, without descending at the parts mounting station I, moves to the dump station J so as to drop the part 1. The suction shaft 92 is returned to the angle origin at this station. If the suction piece 93 presently attached to the vacuum suction device 70 is of the type usable in the next part mounting operation, the vacuum mounting device 70 passes over the suction piece stockers 230 and 231 without stopping and descending. Otherwise, the vacuum suction device 70 exchanges the suction piece 93 at the suction piece stocker 230 or 231. The suction piece stockers 230 and 231 are used alternately. More specifically, when the vacuum suction device 70 which is tentatively named the "first" has detached the suction piece 93 and placed the same on the suction piece stocker 230 at the suction piece detaching station K, the "first" vacuum suction device 70 must pick up another suction piece from the same suction piece stocker 230 at the suction piece attaching station L to keep the number of the suction pieces 93 held thereon constant, but the "second" vacuum suction device 70 is forbidden approaching the suction piece stocker 230 at the suction piece detaching station K at the same time. It is because that no suction piece holder 241 occupies a proper position for the reason as previously described. In addition, if two suction piece holders 241 simultaneously coincide with the centers of the suction piece detaching station K and the suction piece attaching station L, the suction piece holder 241 being moved to the suction piece detaching station K may have been filled with a suction piece 93. Thus, the "second" vacuum suction device 70 has to exchange its suction piece 93 with the suction piece stocker 231. In turn, the suction piece stocker 230 is assigned to the "third" vacuum suction device 70. The vacuum suction device 70 which has thus attached with the suction piece 93 necessary for the next operation, after receiving inspection with respect to the suction piece 93 at the suction piece recognition station O, returns to the parts supply station A to begin new parts mounting operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A parts mounting apparatus in which a series of work stations constitute a closed-loop, comprising:
   parts supply means arranged at a parts supply station;
   printed circuit board support means arranged at a parts mounting station;
   a plurality of suction means to each of which a suction piece is detachably attached, a part supplied by said parts supply means being picked and placed with said suction piece onto a printed circuit board supported by said printed circuit board support means;
   moving means for intermittently moving said suction means so that said suction means is temporarily stopped at respective work stations; and
   suction piece exchanging means holding a plurality of suction pieces and arranged between said parts mounting station and said parts supply station to cross a path of said suction means for exchanging suction pieces with said suction means.

2. A parts mounting apparatus in which a series of work stations constitute a closed loop, comprising:
   part supply means arranged at a parts supply station;
   printed circuit board support means arranged at a parts mounting station;
   suction means to which a suction piece is detachably attached, a part supplied by said part supply means being picked and placed onto a printed circuit board supported on said printed circuit board support means with said suction piece;
   moving means for intermittently moving said suction means so that said suction means is temporarily stopped at respective work stations; and
   suction piece exchanging means holding a plurality of suction pieces and arranged between said parts mounting station and said parts supply station to cross a path of said suction means for exchanging suction pieces with said suction means, and further arranged across two work stations, a first work station being a suction piece detaching station and a second work station being a suction piece attaching station.

3. A parts mounting apparatus in accordance with claim 2, wherein two or more said exchanging means are provided at two or more work stations.

4. A parts mounting apparatus in accordance with claim 2, wherein said exchanging means includes holding means capable of holding a plurality of kinds of suction pieces, means for detaching the suction piece being attached to the suction means so that the detached suction piece is held by said holding means, and means for attaching a desired suction piece being held by said holding means to the suction means.

5. A parts mounting apparatus in accordance with claim 4, further comprising suction shaft adjusting means for adjusting a suction shaft which holds said suction piece to return said suction shaft to an angle origin before said suction piece is detached from the suction means.

6. A parts mounting apparatus in accordance with claim 5, wherein said suction shaft adjusting means includes a roller for applying a rotation force to said suction shaft.

7. A parts mounting apparatus in accordance with claim 4, wherein said holding means includes a plurality of suction piece holding portions in which suction pieces can be held respectively, and further comprising first drive means for driving the respective suction piece holding portions so as to stop said suction piece holding means at said suction piece detaching station or said suction piece attaching station, wherein said exchanging means includes detaching means for detaching the suction piece from the suction means so that the detached suction piece is held by a suction piece holding portion when empty suction piece holding portion is brought into said suction piece detaching station.

8. A parts mounting apparatus in accordance with claim 7, wherein said exchanging means includes attaching means for attaching the suction piece to the suction means when the suction piece holding portion which holds a desired suction piece is brought into said suction piece attaching station.

9. A parts mounting apparatus in accordance with claim 7, further comprising second drive means for approaching or parting said suction means to or from said holding means, wherein the suction piece being attached to said suction means is held by said holding means when said suction means is approached by said holding means, and said exchanging means further includes detaining means for detaining said suction piece being held by said holding means when said suction means is parted from said holding means.

10. A parts mounting apparatus in accordance with claim 9, wherein said detaining means includes claws provided in the path of said suction means so as to engage with said suction piece.

11. A parts mounting apparatus in accordance with claim 8, wherein the suction piece being held by said holding means is transferred to the suction means when said suction means is approached said holding means, and said exchanging means further includes clamping means for clamping the attached suction piece so that the same is detained in said suction means when said suction means is parted from said holding means.

12. A parts mounting apparatus in accordance with claim 11, wherein said clamping means includes an elastic member provided in said suction means so as to engage with said suction piece being attached to said suction means.

13. A parts mounting apparatus in accordance with claim 2, wherein said suction piece includes an identification mark, and said exchanging means includes recognition means for recognizing said identification mark.

14. A parts mounting apparatus in accordance with claim 13, wherein said identification mark is formed so as to be machine-readable, and said recognition means includes means for machine-reading said identification mark.

15. A parts mounting apparatus in accordance with claim 2, wherein the exchanging means includes means for detaching a suction piece from the suction means and storing said suction piece in a holding means.

16. A parts mounting apparatus in accordance with claim 15, further comprising suction shaft adjusting means for adjusting a suction shaft which holds said suction piece to return said suction shaft to an angle origin before said suction piece is detached from said suction means.

17. A parts mounting apparatus in accordance with claim 15, wherein said holding means includes a plurality of suction piece holding portions by which suction pieces can be held respectively, and further comprising first drive means for driving the respective suction piece holding portions so as to stop at said work station, wherein said exchanging means includes detaching means for detaching the suction piece from the suction means so that the detached suction piece is held by a suction piece holding portion when empty suction piece holding portion is brought into said work station.

18. A parts mounting apparatus in accordance with claim 17, wherein said exchanging means includes attaching means for attaching the suction piece to the suction means when the suction piece holding portion which holds a desired suction piece is brought into said work station.

19. A parts mounting apparatus in accordance with claim 17, further comprising second drive means for approaching or parting said suction means to or from said holding means, wherein the suction piece being attached to said suction means is held by said holding means when said suction means is approached said holding means, and said exchanging means further includes detaining means for detaining said suction piece being held by said holding means when said suction means is parted from said holding means.

20. A parts mounting apparatus in accordance with claim 19, wherein the suction piece being held by said holding means is transferred to the suction means when said suction means is approached said holding means, and said exchanging means further includes clamping means for clamping the attached suction piece so that the same is detained in said suction means when said suction means is parted from said holding means.

21. A parts mounting apparatus in which a series of work stations constitute a closed-loop, comprising:
parts supply means arranged at a parts supply station;
printed circuit board support means arranged at a parts mounting station;
suction means to which a suction piece is detachably attached, a part supplied by said parts supply means being picked and placed onto a printed circuit board supported by said printed circuit board support means;
moving means for intermittently moving said suction means so that said suction means is temporarily stopped at respective work stations; and suction piece exchanging means arranged at a work station between said parts mounting station and said parts supply station so as to cross a path of said suction means for exchanging with said suction means the suction pieces attached thereto, each suction piece including an indentification mark, and said exchanging means including recognition means for recognizing said identification mark.

22. A parts mounting apparatus in which a series of work stations constitute a closed-loop, comprising:

parts supply means arranged at a parts supply station;

printed circuit board support means arranged at a parts mounting station;

suction means to which a suction piece is detachably attached, a part supplied by said parts supply means being picked and placed onto a printed circuit board supported by said printed circuit board support means;

moving means for intermittently moving said suction means so that said suction means is temporarily stopped at respective work stations; and suction piece exchanging means arranged at a work station between said parts mounting station and said parts supply station so as to cross a path of said suction means for means the suction pieces attached thereto, said exchanging with said suction exchanging means including holding means capable of holding a plurality of kinds of suction pieces, means for detaching the suction piece attached to the suction means and storing said suction piece in said holding means, and means for attaching the detached suction piece held by the holding means to the suction means.

* * * * *

UNITED STATES PATENT AND TRADEMARK OFFICE
CERTIFICATE OF CORRECTION

PATENT NO. : 4,858,308

DATED : August 22, 1989

INVENTOR(S) : Ken-ichi Komori

It is certified that error appears in the above-identified patent and that said Letters Patent is hereby corrected as shown below:

In the Specification

In Col. 1, line 9, delete "a chip capacitor and chip resistor", insert --chip capacitors and chip resistors--.

In Col. 3, line 15, change "illustration" to --illustrating--.

In the Claims

In claim 11, line 4, after "approached" insert --by--.

In claim 19, line 6, after "approached" insert --by--.

In claim 20, line 4, after "approached" insert --by--.

Signed and Sealed this

Twenty-eighth Day of August, 1990

Attest:

HARRY F. MANBECK, JR.

Attesting Officer

Commissioner of Patents and Trademarks